United States Patent
Hsia et al.

(10) Patent No.: US 8,415,183 B2
(45) Date of Patent: Apr. 9, 2013

(54) WAFER LEVEL CONFORMAL COATING FOR LED DEVICES

(75) Inventors: Hsing-Kuo Hsia, Jhubei (TW); Chih-Kuang Yu, Chiayi (TW); Hung-Yi Kuo, Taipei (TW); Hung-Wen Huang, Hsinchu (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 54 days.

(21) Appl. No.: 12/951,662

(22) Filed: Nov. 22, 2010

(65) Prior Publication Data
US 2012/0129282 A1    May 24, 2012

(51) Int. Cl.
*H01L 21/00* (2006.01)
(52) U.S. Cl. ..................... 438/27; 427/430.1
(58) Field of Classification Search .................. 438/27; 427/430.1
See application file for complete search history.

(56) References Cited

U.S. PATENT DOCUMENTS

| | | | |
|---|---|---|---|
| 6,551,487 B1 * | 4/2003 | Reid et al. | 205/137 |
| 7,431,860 B2 * | 10/2008 | Kawase | 216/83 |
| 7,727,041 B2 | 6/2010 | Ng et al. | |
| 2002/0185965 A1 * | 12/2002 | Collins et al. | 313/501 |
| 2004/0115361 A1 * | 6/2004 | Aegerter et al. | 427/430.1 |
| 2008/0143251 A1 * | 6/2008 | Mathea et al. | 313/504 |
| 2008/0203410 A1 * | 8/2008 | Brunner et al. | 257/98 |
| 2009/0218560 A1 * | 9/2009 | Flaim et al. | 257/9 |
| 2010/0155763 A1 * | 6/2010 | Donofrio et al. | 257/98 |

* cited by examiner

*Primary Examiner* — Shaun Campbell
(74) *Attorney, Agent, or Firm* — Haynes and Boone, LLP (57) ABSTRACT

Provided is a method of fabricating a light-emitting diode (LED) device. The method includes providing a wafer. The wafer has light-emitting diode (LED) devices formed thereon. The method includes immersing the wafer into a polymer solution that has a surface tension lower than that of acetic acid. The polymer solution contains a liquid polymer and phosphor particles. The method includes lifting the wafer out of the polymer solution at a substantially constant speed. The method includes drying the wafer. The above processes form a conformal coating layer at least partially around the LED devices. The coating layer includes the phosphor particles. The coating layer also has a substantially uniform thickness.

19 Claims, 8 Drawing Sheets

WAFER LEVEL CONFORMAL COATING FOR LED DEVICES

BACKGROUND

The semiconductor integrated circuit (IC) industry has experienced rapid growth in recent years. Technological advances in IC materials and design have produced various types of ICs that serve different purposes. One type of these ICs includes photonic devices, such as light-emitting diode (LED) devices. During the fabrication of these LED devices, a phosphor material may need to be coated around the LED devices. However, in traditional LED fabrication processes, the phosphor material may not be uniformly coated around the LED devices. Such non-uniform coating may lead to distortion of the color of the light emitted by the LED devices. Therefore, the LED devices fabricated using traditional methods may suffer from performance degradation.

Therefore, while existing methods of fabricating the LED devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
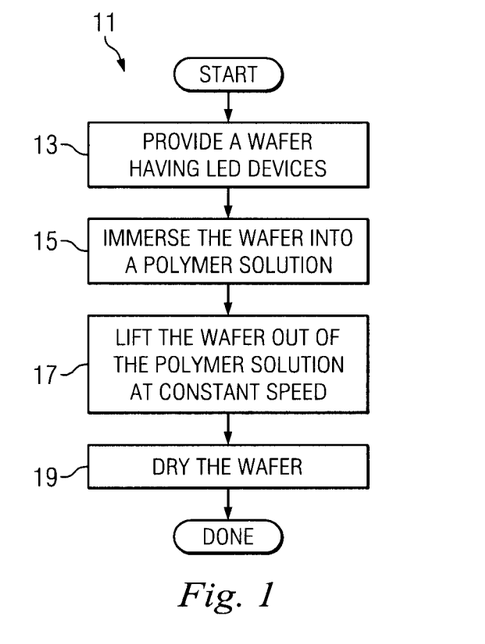
FIG. 1 is a flowchart illustrating a method for fabricating a LED device according to various aspects of the present disclosure.

Illustrated in FIG. 1 is a flowchart of a method 11 for fabricating an LED device according to various aspects of the present disclosure. Referring to FIG. 1, the method 11 begins with block 13 in which a wafer having light-emitting diode (LED) devices formed thereon is provided. The method 11 continues with block 15 in which the wafer is immersed into a polymer solution having a low surface tension. The polymer solution includes a liquid polymer and phosphor particles. The method 11 continues with block 17 in which the wafer is lifted out of the polymer solution at a substantially constant speed. The method 11 continues with block 19 in which the wafer is dried. The processes performed by blocks 15, 17, and 19 result in the formation of a coating layer that is at least partially formed around the LED devices in a conformal manner. The coating layer includes the phosphor particles and has a substantially uniform thickness.

FIGS. 2 to 9 are diagrammatic fragmentary cross-sectional side views of a portion of a wafer 30 at various fabrication stages according to embodiments of the method 11 of FIG. 1. The word "wafer" is used herein to refer to the substrate of the wafer as well as the various components formed on the wafer. It is understood that FIGS. 2 to 9 have been simplified for a better understanding of the inventive concepts of the present disclosure.

Figure 2:
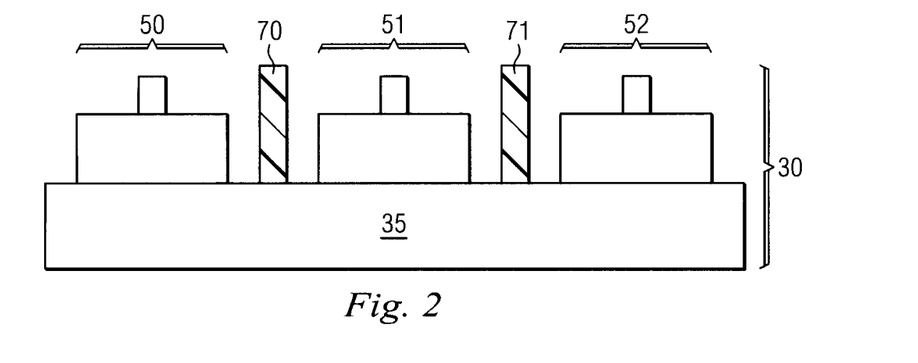
FIGS. 2-12 are diagrammatic fragmentary cross-sectional side views of a portion of a wafer containing LED devices at various stages of fabrication in accordance with various aspects of the present disclosure.

Referring to FIG. 2, the wafer 30 includes a substrate 35, which may also be referred to as a submount. The substrate 35 may include a semiconductor material. In one embodiment, the semiconductor material includes sapphire. In alternative embodiments, the semiconductor material may include silicon.

The wafer 30 may include a plurality of photonic devices, such as light-emitting diode (LED) devices that are formed on the substrate 35. For the sake of providing an example, LED devices 50, 51, and 52 are shown in FIG. 2, though it is understood that many more LED devices similar to the LED devices 50-52 are formed on the substrate 35. The LED devices 50-52 each include a P/N junction formed by oppositely doped layers. In one embodiment, the oppositely doped layers may include oppositely doped gallium nitride (GaN) layers. For example, one of these layers is doped with an n-type dopant such as carbon or silicon, and the oppositely doped layer is doped with a p-type dopant such as magnesium. In other embodiments, the n-type and p-type dopants may include different materials.

In an embodiment, the LED devices 50-52 may each include a multiple-quantum well (MQW) layer that is disposed in between the oppositely doped layers. The MQW layer includes alternating (or periodic) layers of gallium nitride and indium gallium nitride (InGaN). For example, the MQW layer may include ten (or any other number) layers of gallium nitride and ten (or any other number) layers of indium gallium nitride, where an indium gallium nitride layer is formed on a gallium nitride layer, and another gallium nitride layer is formed on the indium gallium nitride layer, so on and so forth.

The doped layers and the MQW layer may all be formed by an epitaxial growth process known in the art. After the completion of the epitaxial growth process, a P/N junction (or a P/N diode) is formed by the disposition of the MQW layer between the doped layers. When an electrical voltage (or electrical charge) is applied to the doped layers, electrical current flows through the LED devices 50-52, and the MQW layer emits radiation such as light in a visible spectrum. The color of the light emitted by the MQW layer corresponds to the wavelength of the light. The wavelength of the light (and hence the color of the light) may be tuned by varying the composition and structure of the materials that make up the MQW layer. The LED devices 50-52 may also include electrodes or contacts that allow the LED devices to be electrically coupled to external devices.

A plurality of photoresist portions are formed on the substrate 35 and in between adjacent LED devices. For the sake of simplicity, photoresist portions 70 and 71 are shown to be formed between the LED devices 50-52. The photoresist portions 70-71 may be formed by depositing a photoresist layer over the substrate 35 and subsequently performing a photolithography process to the photoresist layer. In one embodiment, the photoresist portions 70-71 are formed using a spin coating process, in which case a height of the photoresist portions 70-71 (i.e., the thickness of the deposited photoresist layer) is in a range from about 10 microns (um) to about 12 um. In another embodiment, the photoresist portions 70-71 are formed using a dry film printing process, in which case the height of the photoresist portions is in a range from about 40 um to about 60 um. In comparison, a height of the LED devices 50-52 may be in a range from about 3 um to about 5 um.

Furthermore, the photoresist portions 70-71 may have relatively small lateral dimensions (widths), for example lateral dimensions that are in a range from about 20 um to about 40 um. In comparison, the LED devices 50-52 have much greater lateral dimensions (widths). For example, the LED devices 50-52 may have lateral dimensions that are in a range from about 1000 um to about 3000 um.

It is understood that the photoresist portions 70-71 are formed above a "scribe line" region of the substrate 35 (or of the wafer 30). The scribe line region is a region where sawing or dicing of the substrate 35 will take place in a later process, so as to separate the LED devices such as the LED devices 50-52. Here, the photoresist portions 70-71 are formed to "reserve" a clean scribe line area for when the sawing or the dicing takes place. This will be discussed in more detail later. At this point, the exposed surface of the wafer 30, including the exposed surfaces of the LED devices 50-52, are thoroughly cleaned to substantially reduce or eliminate the presence of contaminant particles on the surface of the wafer 30.

Figure 3:
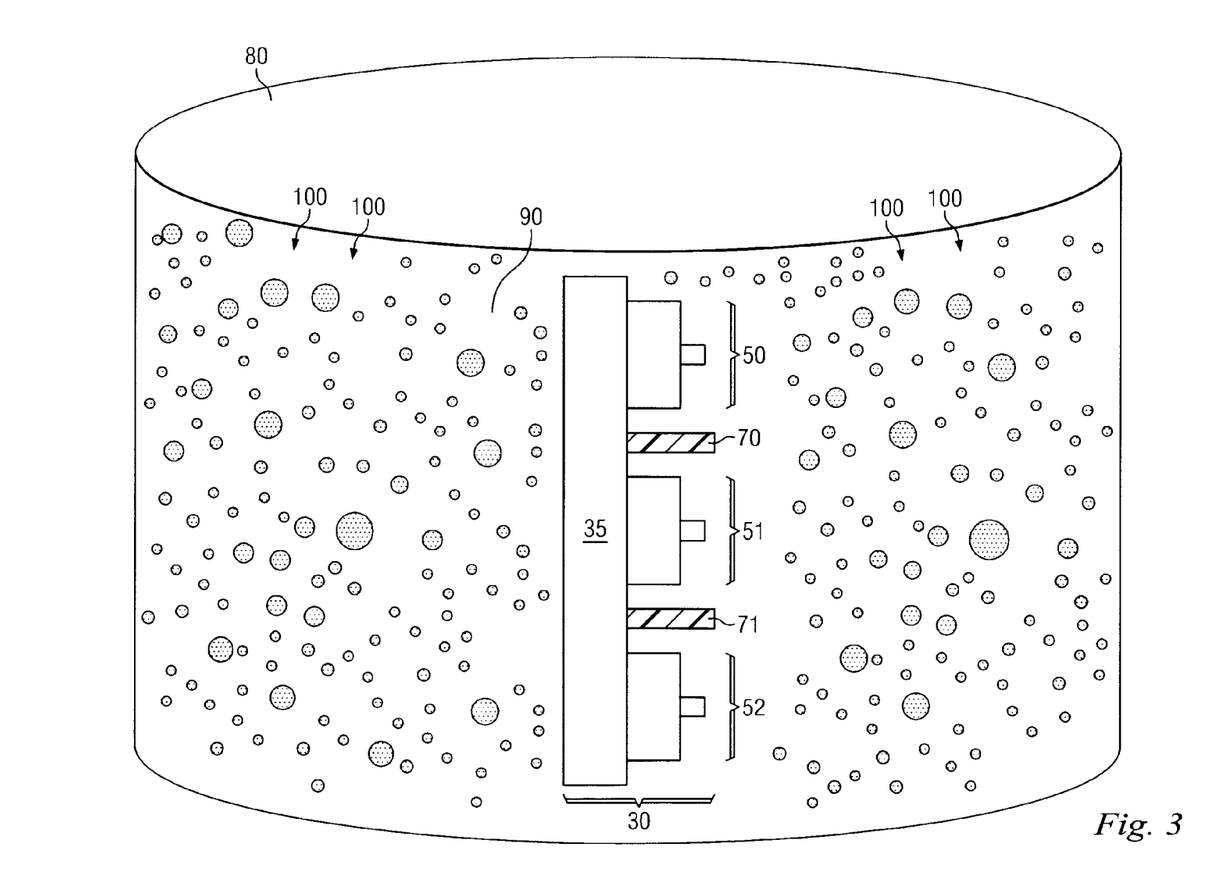

Referring now to FIG. 3, a container 80 is provided. The container 80 contains a polymer solution that includes a liquid polymer 90. The liquid polymer 90 has a low surface tension. In general, surface tension is defined as a property of a surface of a liquid that allows the liquid to resist an external force. Here, the surface tension of the liquid polymer 90 is smaller than the surface tension of acetic acid ($CH_3COOH$, also known as ethanoic acid) under room temperature, where the surface tension of the acetic acid is approximately 27 dyne/centimeter (cm). In an embodiment, the liquid polymer 90 may have a surface tension that is in a range from about 10 dyne/cm to about 25 dyne/cm, where one dyne/cm corresponds to 0.001 Newton/meter. In other embodiments, the surface tension of the liquid polymer 90 may be in a different range, depending on the material composition of the liquid polymer 90.

The liquid polymer 90 is also substantially transparent, meaning that the liquid polymer 90 lets light pass through without substantially absorbing the light. The liquid polymer 90 may include a halogenated material, such as a fluorinated ketone. The liquid polymer 90 may also include fluorocrylate, fluorosilane, and/or a fluorinated hybrid. In an embodiment, the liquid polymer 90 includes a Novec™ liquid polymer from 3M™, which may have a proprietary chemistry called C6-fluoroketone.

The polymer solution also contains a plurality of phosphor particles 100. The phosphor particles 100 are added to the liquid polymer 90 and mixed uniformly with the liquid polymer 90. The liquid polymer 90 may be stirred during and/or after the phosphor particles 100 are added, so as to increase the uniformity of the distribution of the phosphor particles 100 within the liquid polymer 90. The phosphor particles 100 are made of a phosphor material, which can be used to exhibit luminescence. Phosphor materials may include both phosphorescent materials and fluorescent materials. In practical LED applications, the phosphor material may be used to transform the color of the light emitted by an LED device. For example, in an embodiment, the phosphor particles 100 can transform a blue light emitted by the LED devices 50-52 into a white light. By changing the material composition of the phosphor particles 100, the desired light color emitted by the LED devices 50-52 may be achieved.

As is shown in FIG. 3, the phosphor particles 100 may have different sizes and shapes. For example, the phosphor particles 100 may follow an approximately Gaussian distribution (or another random distribution) in terms of their sizes. For purposes of simplicity, however, the sizes and shapes of the phosphor particles 100 may not be reflected accurately in FIG. 3 or the following figures.

After the phosphor particles 100 are mixed substantially evenly with the low surface tension liquid polymer 90, the wafer 30 is placed inside the container 80 and fully immersed into the liquid polymer 90. In the embodiment shown in FIG. 3, the wafer 30 is turned or rotated by a substantially right angle (90 degrees) and is then placed in the container 80. In an alternative embodiment, the wafer 30 may be placed in the container 80 in an upside down manner, that is, the LED devices 50-52 are facing toward the bottom of the container 80.

As the wafer 30 is immersed in the liquid polymer 90, the phosphor particles 100 begin to be gradually coated around the wafer 30. The phosphor particles 100 are coated around the wafer 30 in a substantially conformal manner. Thus, the phosphor particles 100 are also coated around the LED devices 50-52, the photoresist portions 70-71, as well as the back side of the wafer 30. According to one embodiment, the immersion time is in a range from about 15 seconds to about one minute for substantial phosphor particle coating to take place around the wafer 30. In other embodiments, the immersion time may be changed to adjust the phosphor coating.

Figure 4:
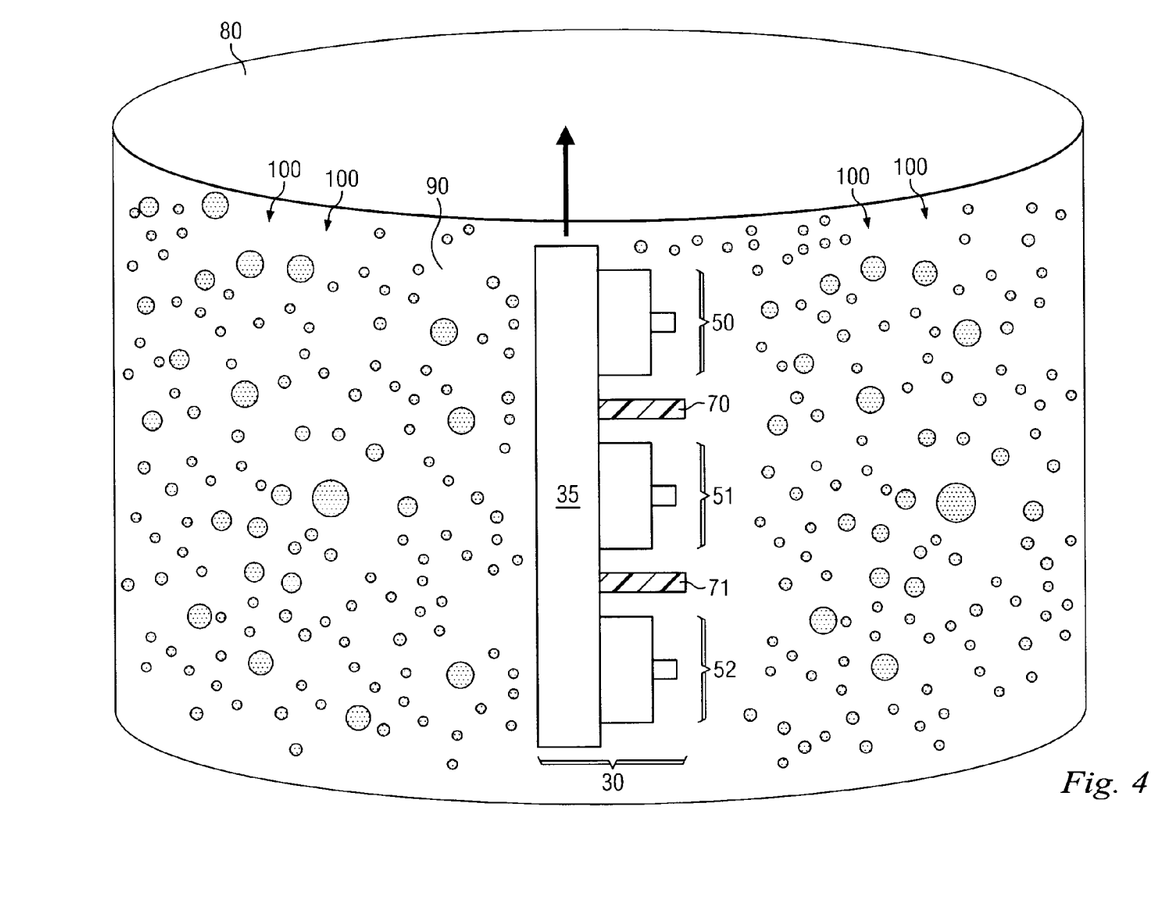

Referring now to FIG. 4, after being fully immersed in the liquid polymer 90, the wafer 30 is pulled up and out of the container 80 at a substantially constant (or steady) speed. Since the wafer 30 is immersed in the liquid polymer 90 at a right angle or upside down, the presence of air pockets is substantially reduced as the wafer 30 is pulled upwards. Also, due to the low surface tension of the liquid polymer 90, the coating of the phosphor particles 100 around the LED devices 50-52 may be substantially uniform, even as the wafer 30 is being lifted out of the liquid polymer 90. In other words, the reduced surface tension of the liquid polymer means that the phosphor particles 100 will not easily disperse away as the wafer 30 is being lifted.

A thickness of the phosphor coating is in part determined by, or correlated to, the speed at which the wafer 30 is lifted out of the container 80. For example, a slower lifting speed results in a greater thickness of the phosphor coating, and a faster lifting speed results in a smaller thickness of the phosphor coating.

Figure 5:
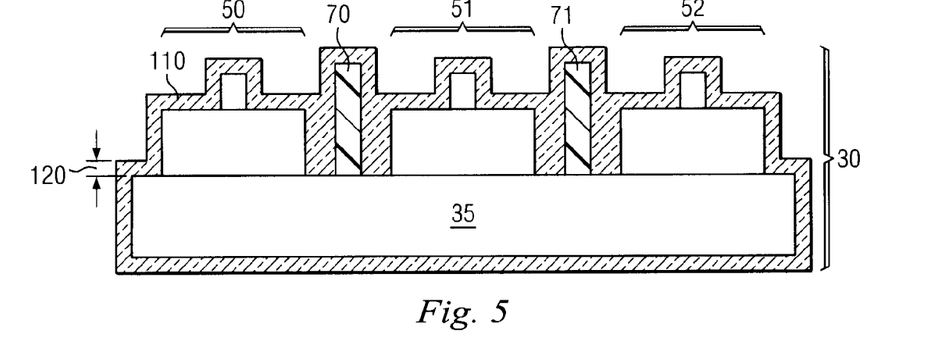

Referring now to FIG. 5, the wafer 30 is completely pulled out of the liquid polymer 90 and is thereafter dried by air, or by another suitable mechanism. The residue from the liquid polymer 90 and the phosphor particles 100 form a substantially uniform coating layer 110 around the wafer 30, including around the LED devices 50-52, the photoresist portions 70-71, and the back side of the wafer 30. The coating layer 110 may also be referred to as a phosphor coating layer 110. For the sake of simplicity, the phosphor particles 100 are not specifically illustrated inside the coating layer 110.

In an embodiment, the coating layer 110 has a thickness 120 that is in a range from about 0.5 um to about 2 um. As discussed above, the thickness 120 of the coating layer 110 is determined in part by the speed at which the wafer 30 is lifted out of the liquid polymer 90. Thus, the thickness 120 of the coating layer 110 may have other values, depending on the speed at which the wafer 30 is lifted out of the liquid polymer 90. Also, as the coating layer 110 becomes dry, it quickly turns into a permanent film that is not easily dissolved. Further, the coating layer 110 has relatively good adhesion to the wafer 30 (including the LED devices 50-52). Thus, the coating layer 110 will not be easily washed away either. These properties may be beneficial because the wafer 30 may need to be immersed again later.

Figure 6:
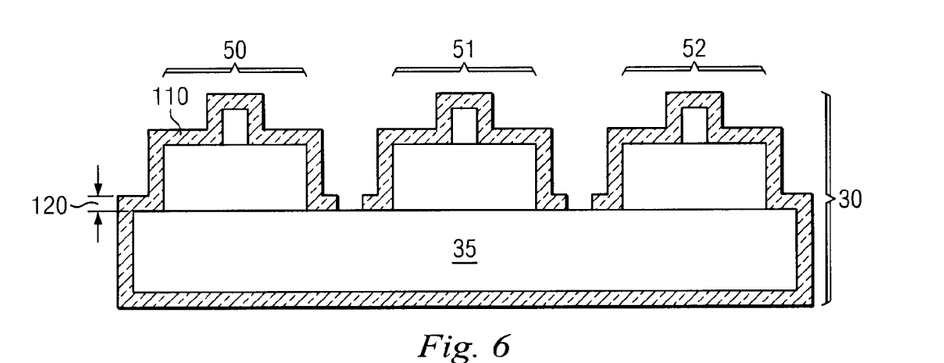

Referring to FIG. 6, the photoresist portions 70-71 (shown in FIGS. 2-5) are removed, using a photoresist removal process known in the art. For example, the photoresist portions 70-71 may be removed using a stripping process or a peeling process. The removal of the photoresist portions 70-71 is carried out in a manner so as to not alter the color or the transparency of the coating layer 110. For example, the temperature of the photoresist removal process may be controlled to be in a specific range. In an embodiment, the temperature range may vary from about 150 degrees Celsius to about 200 degrees Celsius.

At this time, each of the LED devices 50-52 is coated with the conformally-formed uniform coating layer 110. If no additional color transformation is needed, then the embodiments of the present disclosure may proceed to other processes to complete the packaging of the LED devices 50-52. For example, the wafer 30 may undergo a wafer cutting or dicing process to separate the LED devices 50-52 into individual dies. The wafer cutting or dicing process may be performed on the scribe line region of the wafer 30—between the adjacent LED devices. Had the photoresist portions 70-71 not been formed, the coating layer 110 would have covered the scribe line region, thus making the wafer cutting or dicing more difficult. Here, the photoresist portions 70-71 were formed to reserve a clean wafer surface in the scribe line region, as discussed above. The removal of the photoresist portions 70-71 ensures that there is now a clean area or surface in the scribe line region, which makes wafer cutting or dicing easier.

If further color transformation is desired, or if the thickness 120 of the coating layer 110 needs to be further adjusted, then the photoresist portions 70-71 are not removed yet, and the embodiments of the present disclosure may proceed further for additional cycle (or cycles) of phosphor coating, as discussed below.

Figure 7:
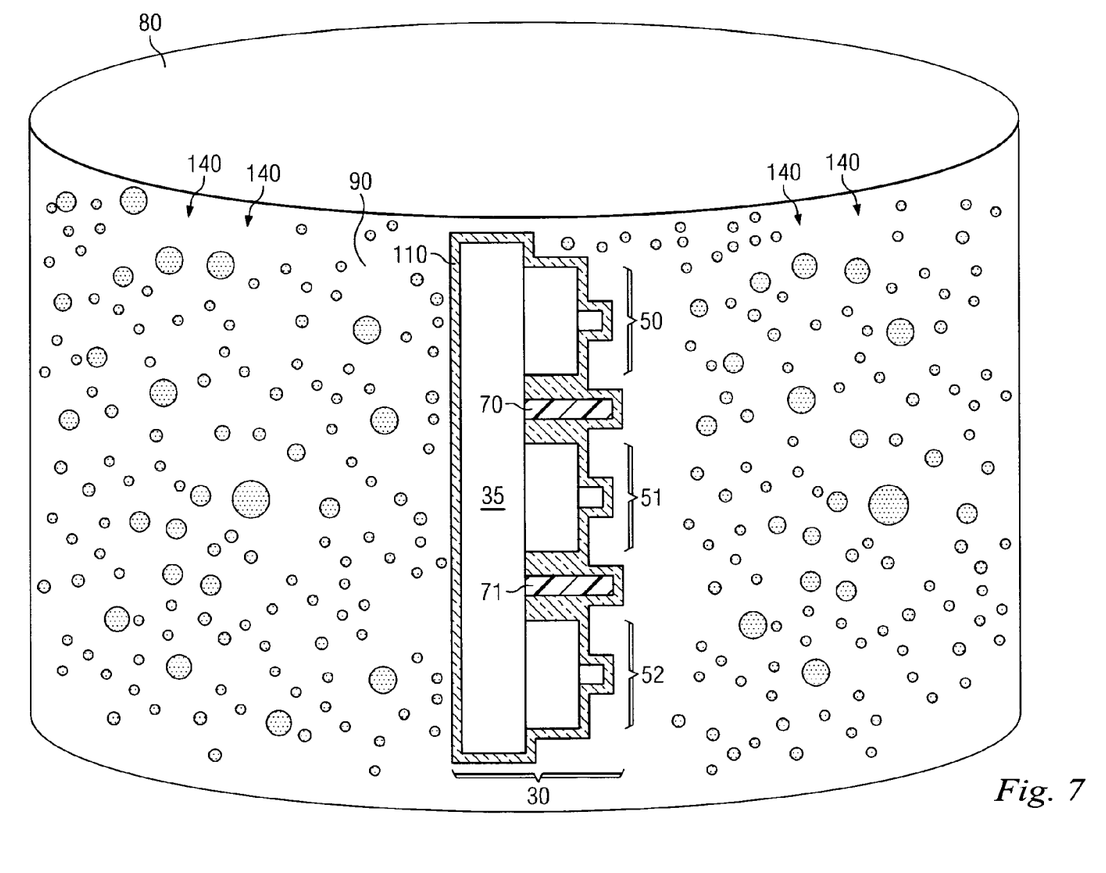

Referring to FIG. 7, the low surface tension liquid polymer 90 is emptied out of the container 80. The container 80 is then filled with additional low surface tension liquid polymer 90. Alternatively, another container similar to the container 80 is provided. The additional container may then be filled with the additional low surface tension liquid polymer 90. Thereafter, a plurality of phosphor particles 140 are added to the liquid polymer 90 and uniformly mixed therein in a similar manner as described above with reference to FIG. 3.

The phosphor particles 140 are similar to the phosphor particles 100 (shown in FIGS. 3-4), except that they are associated with one or more different colors than the colors associated with the phosphor particles 100. For example, the phosphor particles 100 may turn a blue light into a white light, and the phosphor particles 140 may turn a blue light into a different color light. As such, the light emitted by the LED devices 50-52 may be further adjusted by the phosphor particles 140 once the phosphor particles are coated onto the LED devices.

After the phosphor particles 140 are evenly mixed with the liquid polymer 90, the wafer 30 (along with the dried coating layer 110 formed thereover) is immersed into the liquid polymer 90, similar to what was done previously (discussed above with reference to FIG. 3). Since the coating layer 110 is dried into a permanent film that is not easily dissolvable, the immersion of the wafer 30 into the liquid polymer 90 will not wash away or otherwise remove/destroy the coating layer 110.

Figure 8:
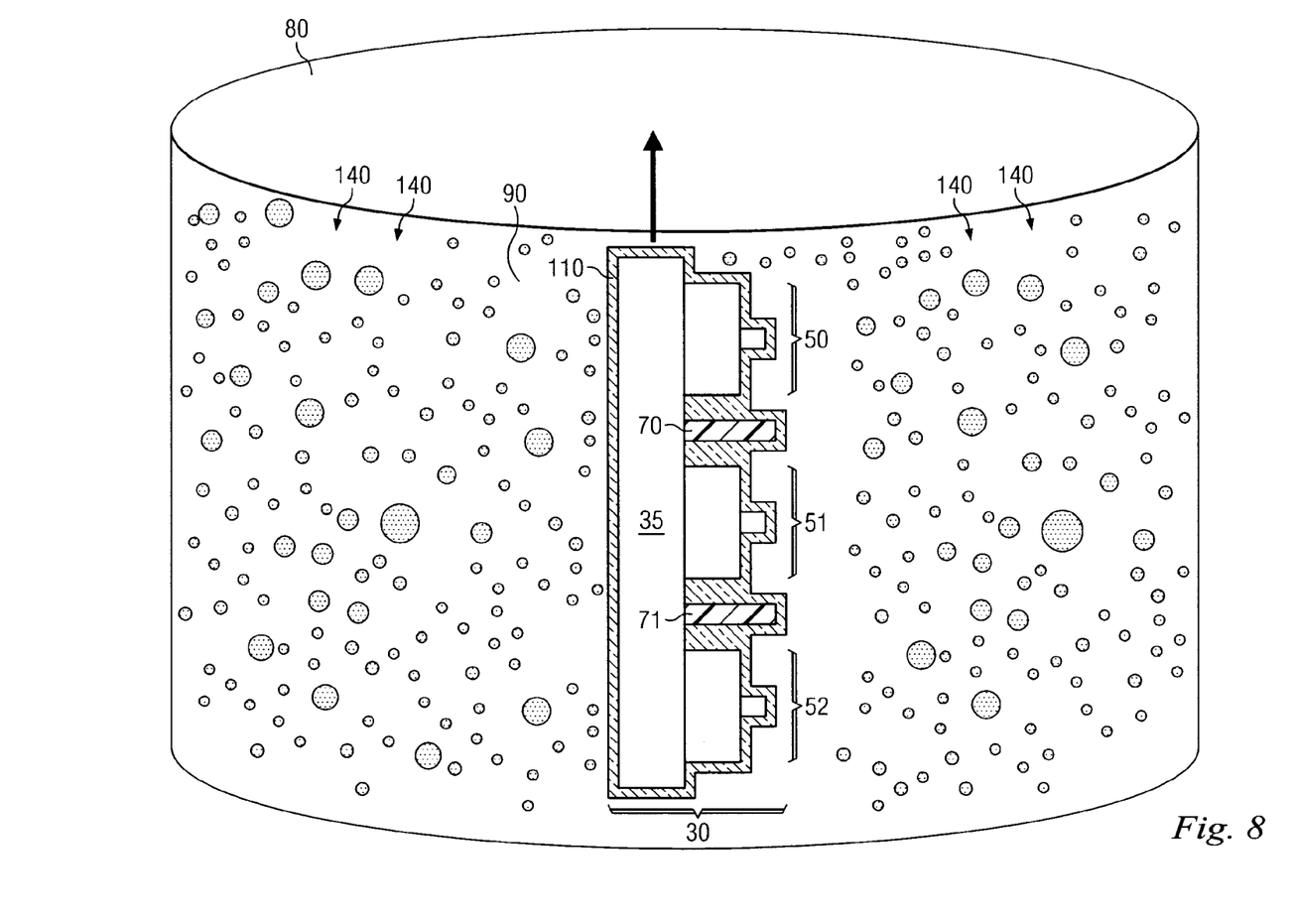

Referring now to FIG. 8, the wafer 30 is pulled up and out of the liquid polymer 90 in a manner similar to what was discussed above with reference to FIG. 4. As mentioned above, this will result in a conformal coating to be gradually formed uniformly on the coating layer 110. If a different thickness for this additional coating is desired (as opposed to having the same thickness as the coating layer 110), then the speed at which the wafer 30 is lifted out of the liquid polymer 90 may be adjusted to obtain the different thickness.

Figure 9:
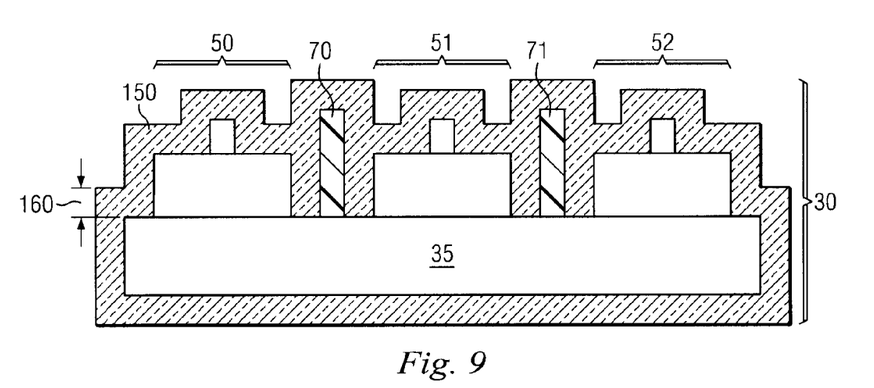

Referring now to FIG. 9, the wafer 30 is completely pulled out of the liquid polymer 90 and is dried by air or by another suitable mechanism. The residue from the liquid polymer 90 and the phosphor particles 140 together form a substantially uniform coating layer 150, which includes the coating layer 110. As discussed above, the coating layer 150 may have a thickness 160 that is determined in part by the speed at which the wafer 30 is lifted out of the liquid polymer 90. The thickness 160 is different from the thickness 120 (shown in FIG. 5) of the coating layer 110, for example, greater than the thickness 120. Further, as the coating layer 150 becomes dry, it quickly turns into a permanent film that is not easily dissolved, similar to the coating layer 110. Afterwards, the photoresist portions 70-71 may be removed.

The immersion-coating cycle described above in association with FIGS. 2-9 may be repeated several times to obtain a desired phosphor coating layer around the LED devices 50-52 so that the desired light colors may be emitted by the LED devices 50-52. In an embodiment, a thickness of the finally-formed coating layer may be in a range from about 5 um to about 15 um. Also, as discussed above, additional packaging processes may be performed to complete the packaging of the LED devices 50-52. For example, the wafer 30 may be cut or diced along the scribe lines, and the formation and removal of the photoresist portions 70-71 help reserved a clean area for the wafer dicing. Also, other fabrication processes may be performed, but these processes are not illustrated or described herein for the sake of simplicity.

Figure 10:
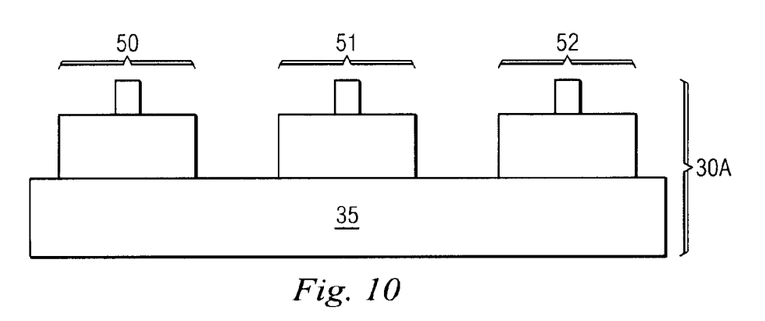
Figure 11:
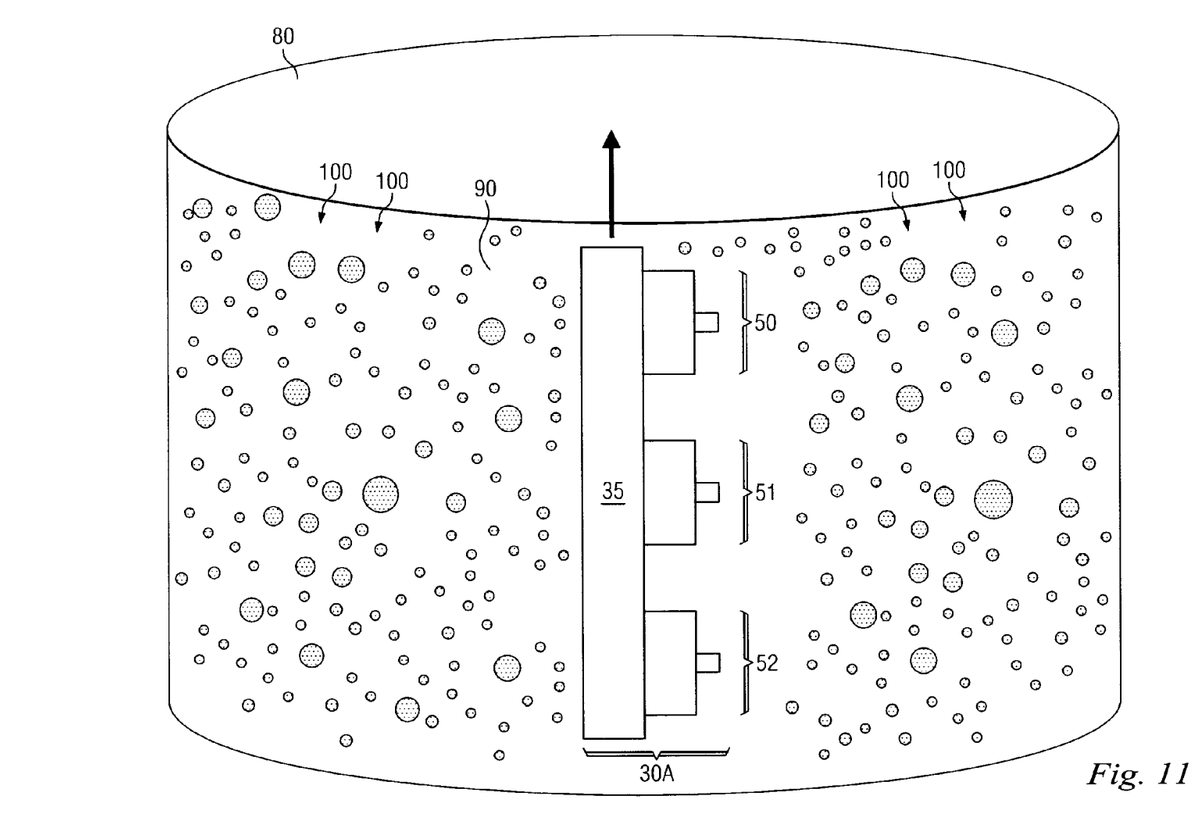
Figure 12:
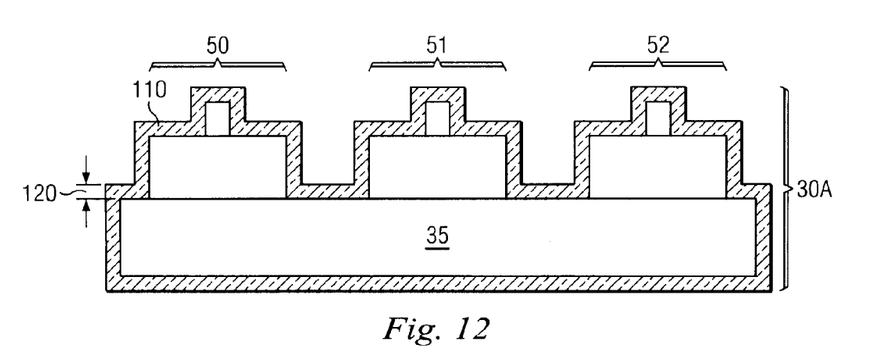

FIGS. 10-12 illustrate yet another alternative embodiment of forming a uniformly coating phosphor coating layer according to various aspects of the present disclosure. For the sake of consistency and clarity, similar elements are labeled the same in FIGS. 2-9 and FIGS. 10-12. Referring to FIG. 10, a wafer 30A is formed in the alternative embodiment. LED devices 50-52 are formed on the wafer 30A, but no photoresist portions are formed between adjacent LED devices in the scribe line region of the wafer 30A.

Referring now to FIG. 11, the wafer 30A and the LED devices 50-52 formed thereon are immersed in the liquid polymer 90 with the phosphor particles 100 mixed in uniformly. As discussed above, a phosphor coating begins to form around the wafer 30A. Referring now to FIG. 12, the wafer 30A is lifted out of the liquid polymer 90 and is dried. The residue from the liquid polymer 90 and the phosphor particles 100 together form a substantially uniform coating layer 110. As discussed above, the coating layer 110 may have a thickness 120 that is determined at least in part by the speed at which the wafer 30A is lifted out of the liquid polymer 90. Additional liquid polymer immersion cycles may be subsequently performed to adjust the thickness of the coating layer. Thereafter, the wafer 30A may be cut or diced to separate the adjacent LED devices.

The embodiments of the present disclosure discussed above have advantages over existing methods. It is understood, however, that other embodiments may offer different advantages, and that no particular advantage is required for any embodiment. One of the advantages is that a substantially uniform coating of phosphor material may be applied on each individual LED device. The uniform coating significantly reduces color distortion or undesired color variation between different LED devices. In other words, the color performance of the LED devices is substantially improved.

An additional advantage is that the phosphor coatings are formed in a conformal manner. The conformal coating can enhance a blue-to-white light conversion efficiency. Yet another advantage is that the coating is formed on a wafer level—for all the LED devices on a wafer at the same time. Thus, such wafer level processes may lead to lower fabrication costs and faster fabrication time.

Another advantage is that in the embodiments where the photoresist portions are formed, the formation and removal of these photoresist portions result in a clean surface in the scribe line region, thereby making wafer cutting or dicing easier.

One of the broader forms of the present disclosure involves a method. The method includes providing a wafer having light-emitting diode (LED) devices formed thereon. The method also includes immersing the wafer into a polymer solution having a surface tension lower than that of acetic acid, wherein the polymer solution comprises a liquid polymer and phosphor particles. The method also includes lifting the wafer out of the polymer solution at a substantially constant speed. The method also includes drying the wafer, thereby forming a conformal coating layer at least partially around the LED devices. The coating layer includes the phosphor particles and has a substantially uniform thickness.

Another of the broader forms of the present disclosure involves a method. The method includes providing a wafer containing a plurality of light-emitting diode (LED) devices. The method also includes providing a polymer, the polymer being in liquid form and having surface tension lower than that of acetic acid. The method also includes mixing a phosphor material with the polymer to form a mixture. The method also includes immersing the wafer in the mixture. The method also includes pulling the wafer out of the mixture at a substantially constant speed. The method also includes drying the wafer.

Still another of the broader forms of the present disclosure involves a method. The method includes providing a semiconductor device that includes a substrate and a plurality of photonic devices formed over the substrate. The method also includes mixing phosphor particles into a polymer material to form a mixture. The polymer material is in liquid form and has a surface tension lower than a surface tension of an acetic acid. The method also includes forming a conformal coating around the photonic devices. The forming includes: placing the semiconductor device in the mixture; removing the semiconductor device from the mixture, and thereafter drying the semiconductor device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
providing a wafer having a plurality of light-emitting diode (LED) devices formed thereon and a plurality of photoresist elements located between adjacent LED devices;
immersing the wafer into a polymer solution having a surface tension lower than that of acetic acid, wherein the polymer solution comprises a liquid polymer and phosphor particles;
lifting the wafer out of the polymer solution at a substantially constant speed;
drying the wafer, thereby forming a conformal coating layer at least partially around each of the LED devices, the coating layer including the phosphor particles and having a substantially uniform thickness; and
thereafter removing the photoresist elements.

2. The method of claim 1, wherein the liquid polymer contains a fluorinated ketone material.

3. The method of claim 1, wherein the surface tension of the polymer solution is in a range from about 10 dyne/centimeter to about 25 dyne/centimeter.

4. The method of claim 1, wherein the liquid polymer is substantially transparent.

5. The method of claim 1, wherein phosphor particles are substantially evenly mixed with the liquid polymer before the wafer is immersed into the polymer solution.

6. The method of claim 1, wherein the coating layer further includes a portion of the liquid polymer that has been dried.

7. The method of claim 1, wherein the substantially uniform thickness of the coating layer is correlated with the speed at which the wafer is lifted out of the polymer solution.

8. The method of claim 1, wherein the photoresist elements are located over a scribe-line region of the wafer.

9. The method of claim 1, repeating the immersing, the lifting, and the drying, wherein a different low surface tension polymer solution that contains different phosphor particles is used, and wherein the repeating the immersing, the lifting, and the drying results in an additional coating layer that is conformally formed around the LED devices.

10. A method, comprising:
providing a wafer containing a plurality of light-emitting diode (LED) devices and a plurality of photoresist portions disposed between adjacent LED devices;
providing a polymer, the polymer being in liquid form and having surface tension lower than that of acetic acid;
mixing a phosphor material with the polymer to form a mixture;
thereafter immersing the wafer in the mixture;
pulling the wafer out of the mixture at a substantially constant speed; and
drying the wafer;
thereafter removing the photoresist portions.

11. The method of claim 10, wherein a coating is formed around the LED devices in a conformal manner and has a substantially uniform thickness as a result of the immersing, the pulling, and the drying.

12. The method of claim 11, wherein the coating includes a dried residue of the polymer and the phosphor material.

13. The method of claim 11, wherein the coating has a thickness that is correlated with the speed at which the wafer is pulled out of the mixture.

14. The method of claim 10, wherein the providing the wafer is carried out in a manner so that the photoresist elements are each disposed in a scribe-line region of the wafer.

15. The method of claim 10, wherein the polymer is a first polymer, the phosphor material is a first phosphor material, and the mixture is a first mixture; and further including:

providing a second polymer, the second polymer having a material composition similar to the first polymer;

mixing a second phosphor material with the second polymer to form a second mixture;

after the drying, immersing the wafer in the second mixture;

pulling the wafer out of the second mixture at a substantially constant speed; and thereafter drying the wafer.

16. A method, comprising:

providing an apparatus that includes a substrate and a plurality of photonic devices formed over the substrate and one or more photoresist components respectively disposed between adjacent photonic devices;

mixing phosphor particles into a polymer material to form a mixture in a container, the polymer material being in liquid form and having a surface tension lower than a surface tension of an acetic acid, wherein the polymer material contains a halogenated material; and forming a conformal coating around the photonic devices, the forming including:

placing the apparatus in the mixture, wherein the apparatus is rotated upside down as it is placed in the mixture, such that the photonic devices are facing a bottom of the container;

removing the apparatus from the mixture;

thereafter drying the apparatus; and removing the photoresist components after the drying the apparatus.

17. The method of claim 16, wherein the forming the coating is carried out in a manner so that the coating includes a portion of the polymer material and a portion of the phosphor particles.

18. The method of claim 16 wherein the photonic devices are light-emitting diode (LED) devices; and further including forming an additional coating around the LED devices in a conformal manner by repeating the placing, the removing, and the drying, wherein a different group of phosphor particles are used to form the additional coating.

19. The method of claim 16 wherein the apparatus is removed from the mixture by being lifted out of the mixture at a steady speed, and wherein the speed is correlated with a thickness of the coating around the photonic devices.

* * * * *